United States Patent [19]

Freeman

[11] Patent Number: 4,965,643
[45] Date of Patent: Oct. 23, 1990

[54] SCHOTTKY DIODE FOR INTEGRATED CIRCUITS

[75] Inventor: Guy R. Freeman, Colorado Springs, Colo.

[73] Assignee: United Technologies Corporation, Hartford, Conn.

[21] Appl. No.: 319,033

[22] Filed: Mar. 6, 1989

[51] Int. Cl.⁵ .......................................... H01L 29/48
[52] U.S. Cl. ...................................... 357/15; 357/13; 357/59
[58] Field of Search ................... 357/15, 59 A, 91, 13

[56] References Cited

U.S. PATENT DOCUMENTS

| 4,502,894 | 3/1985 | Seto et al. | 357/91 |
| 4,584,594 | 4/1986 | Vora et al. | 357/15 |
| 4,628,339 | 12/1986 | Vora et al. | 357/15 |

FOREIGN PATENT DOCUMENTS

| 58-17679 | 2/1983 | Japan | 357/15 |
| 58-17680 | 2/1983 | Japan | 357/15 |

Primary Examiner—Andrew J. James
Assistant Examiner—Mark Prenty

[57] ABSTRACT

An improved Schottky diode may be placed above an insulating layer such as the field oxide instead of within an epitaxial layer. The forward voltage, dynamic resistance and breakdown voltage may all be tailored.

17 Claims, 2 Drawing Sheets

SCHOTTKY DIODE FOR INTEGRATED CIRCUITS

DESCRIPTION

TECHNICAL FIELD

The field of the invention is that of integrated circuit processing.

BACKGROUND ART

A conventional electrical device is the Schottky diode, which is formed by a junction between silicon and metal. In prior art integrated circuit fabrication, the Schottky diode structure was fabricated into an epitaxial "tub" that was formed in the conventional epitaxial layer of an integrated circuit wafer. There was inevitably a capacitance associated with the walls of the tub which tended to slow down the operation of the diode, and also parasitic leakages from the isolation diodes. Further, the fabrication of the tub required additional processing steps and the necessary tolerances meant that the total area required for the diode was greater because of the tub. Since the tub was several microns thick, the diode had a rather high forward resistance because of the long path through which current had to flow.

DISCLOSURE OF INVENTION

The invention relates to an improved Schottky diode for integrated circuit processing in which several parameters of the diode may be tailored in order to provide a device meeting system requirements.

A feature of the invention is the ability to form a diode in a layer of polysilicon above a layer of oxide, with parameter control provided by doping the upper and lower surfaces of the poly and the oxide.

Another feature of the invention is that the thickness of the diode structure is considerably reduced compared to the prior art and the capacitance associated with the diode is also considerably reduced.

Yet another feature of the invention is the insulating oxide underlying the diode, which eliminates the possibility of a parasitic device being associated with the polysilicon Schottky.

Other features and advantages will be apparent from the specification and claims and from the accompanying drawings which illustrate an embodiment of the invention.

BRIEF DESCRIPTION OF DRAWINGS

FIG. 3b illustrates a schematic diagram of a circuit incorporating the embodiment of FIG. 3a.

BEST MODE FOR CARRYING OUT THE INVENTION

Figure 1:
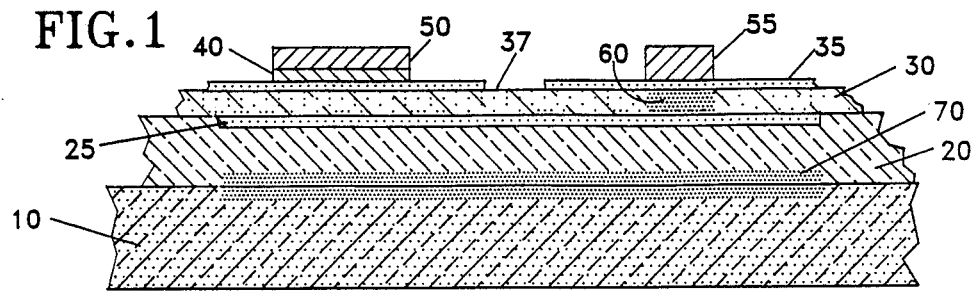
FIG. 1 illustrates in cross-section an embodiment of the invention.

Referring now to FIG. 1, there is shown in outline form a cross section of a substrate 10, which may be a silicon wafer or an epitaxial (EPI) layer formed above the wafer and field oxide layer 20, above which is formed the diode structure. The cathode is an aluminum or other metal layer indicated with the numeral 50 on the left and the anode is another metal layer 55 on the right. A conventional barrier metal layer 40 is provided between cathode 50 and polysilicon layer 30. This barrier metal layer, which may be a conventional titanium-tungsten mixture, is conventional and is formed according to the art in a rapid isothermal process including exposing a wafer to a temperature of 760 degrees C. for 28 seconds.

Below polysilicon (poly) layer 30 and between cathode 50 and anode 55, there is an implanted region of field oxide or of silicon nitride 20, referred to as the shunt layer, indicated with the numeral 25. The layer carrying the current will be referred to as being "between" the cathode and anode whether it has the configuration shown in FIG. 1 or is in a vertical sandwich. This implanted area may illustratively be formed by a dose of arsenic implanted at a voltage of 25 Kev with a concentration of $10^{16}$ ions per square centimeter. Polysilicon layer 30 itself is conventional intrinsic silicon, which has a high resistivity that is lowered somewhat by diffusion from adjacent layers in later steps. On the top layer 30, there is a second implanted area 35, referred to as the forward voltage control layer, which may be a phosphorous implant with a concentration of $10^{16}$ ions per square centimeter at a voltage of 25 Kev. Below anode 55, there is an area indicated with the numeral 60 which is an ohmic contact which is formed from an N+ implantation with a conventional concentration of $1.5 \times 10^{16}$.

The current flow is preferentially down through layer 30 and along shunt layer 25 to ohmic contact 60. The resistivity of the shunt layer is made to be much less than that of poly layer 30 by a sufficiently high dopant concentration. Since poly layer 30 is the conventional thickness of first level polysilicon of about 1 micron, it will be much thinner than the corresponding thickness in prior art diodes, and the effect of the poly on the diode impedance can be held to a small amount. The shunt layer could also be formed in the lower portion of poly layer 30 by setting the implant voltage appropriately and, in practice, there will always be a dopant distribution such that some of the dopant remains in layer 30.

With this process, $V_f$, the forward turn-on voltage, may be adjusted as required by means of a combination of the barrier metal and the implant dose 35. In the illustrative embodiment, it may be varied over a range from 0.01 volt to 0.6 volts. $R_d$, the dynamic forward resistance of the diode may be controlled by the combination of implant 25 and implant 60, together with the effective resistance of the poly layer. A larger magnitude of the forward voltage control layer-35 dose, will decrease Vf and Rd, but will also decrease Bv, the reverse breakdown voltage. $B_v$, the reverse breakdown voltage, may be controlled by a combination of the thickness of the polysilicon layer 30, the dopant concentration of that layer and the implants.

In the illustrative embodiment, the same mask can be used to define implants 25 and 35 and also to define poly layer 30. In the case of an MOS process, layer 30 could be the same first layer of polysilicon that is used to form the transistor gates. In a bipolar process, layer 30 could be formed at the same time as polysilicon resistors and-/or polysilicon emitters.

Not only is the device compatible with bipolar and MOS technology, it is also compatible with thin film resistor processing in the sense that the resistor processing does not interact with the Schottky processing. The "hot" process of siliciding the barrier metal is a rapid isothermal anneal step that does not affect the stoichiometry of the resistors. The conventional process of forming Schottky diodes would supply too much heat to the resistors and not enough to the Schottky to perform the siliciding step.

Figure 2:
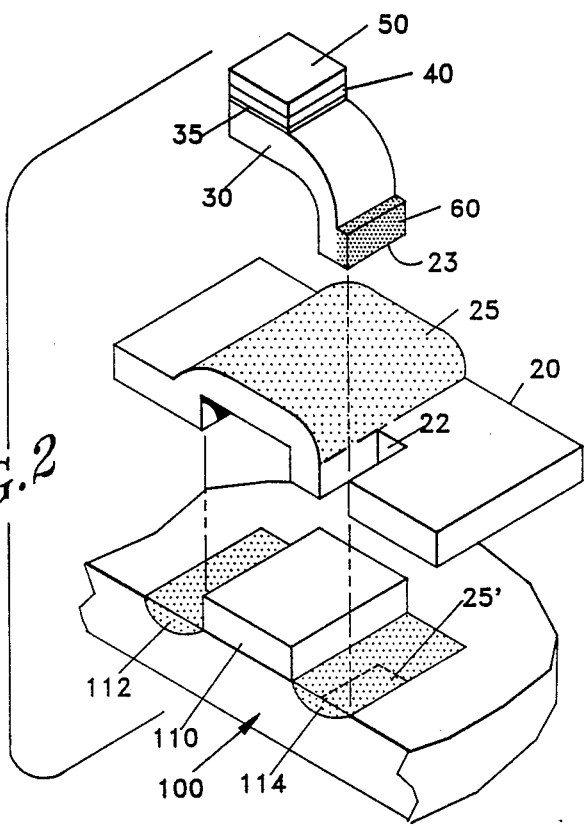
FIG. 2 illustrates in partially schematic, partially pictorial form another embodiment of the invention.

The invention can be further integrated in order to form more compact circuits. Referring now to FIG. 2, there is shown an exploded view of a Schottky diode constructed according to the invention superimposed on an MOS transistor. At the bottom of the Figure, transistor 100 has source and drain, 112 and 114, and gate electrode 110. Above this transistor, there is shown a portion of oxide 20 which is the first insulating layer and corresponds to layer 20 of FIG. 1. Above layer 20, there is shown an embodiment of the invention with polysilicon layer 30 and cathode 50. An aperture 22 has been formed in layer 20 through which stub 23 (the anode of the Schottky diode) will extend to make contact with electrode 114 of the transistor. Thus, the diode according to the invention can be used as required in a circuit to clamp one transistor electrode, giving rise to an integrated three dimensional structure that will save additional integrated circuit area. Implant layer 25 is shown as extending over a portion of layer 20 and also extending down through aperture 22 into area 25' on drain 114. As shown in the Figure, there is a gap in implanted area 25 as it passes through the thickness of layer 20. If desired, a wet etch or other technique may be used to provide a slope in the side of aperture 22 so that there is a continuous implant down to electrode 114.

Layer 30 is formed as before and is shown as conforming to the shape of layer 20. The same implanted area 60 is shown in stub 23.

The term "in proximity" will be used herein to indicate that the shunt region 25 has reached a position such that it is in electrical contact with the anode, whether it is physically displaced from the anode (above or below) and connected to it by an ohmic contact, as in FIG. 1, or in physical contact with the anode or the next element of the circuit, as in FIG. 2 (also above or below). It may also mean that the shunt region is displaced laterally from the actual anode contact or pad and connected electrically, together with other geometric variations that will be evident to those skilled in the art. Many other embodiments of the invention, in which diodes constructed according to the invention are combined in compact, space-saving arrangements will be evident to those skilled in the art. This example would be useful in clamping the gate of the transistor to ground or some reference voltage. As another example, the diode may be placed next to transistor 100 instead of on top of it. This would be useful in the case where the diode is clamping a circuit pad and must be capable of handling large currents. Diodes constructed according to the invention may also be integrated with bipolar transistors, of course.

Figure 4:
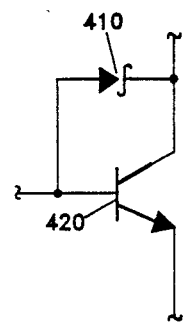
FIG. 4 illustrates a clamping circuit using the invention.

An example is shown in FIG. 4, in which diode 410, constructed according to the invention, is used to clamp the base and emitter of transistor 420. The structure may be physically integrated as in the example of FIG. 2 or the two devices may be displaced from one another.

Figure 3A:
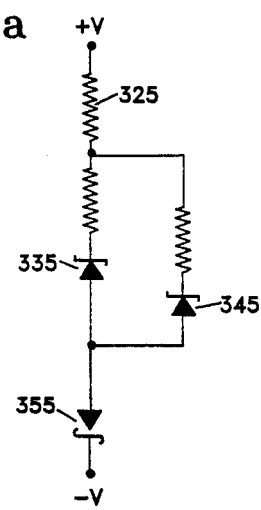
FIG. 3a illustrates in partially schematic, partially pictorial form another embodiment of the invention.
Figure 3B:
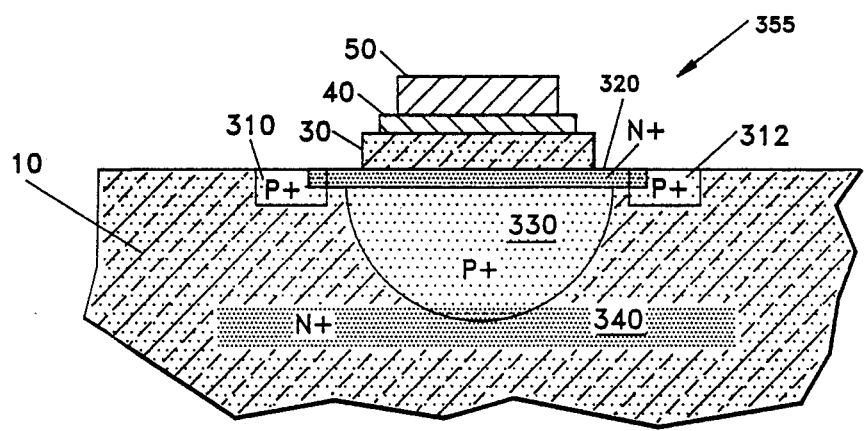

A particular application of the invention is the construction of a zero temperature coefficient device constructed from zener diodes connected with the Schottky as illustrated schematically in FIG. 3a and in cross section in FIG. 3b.

As can be seen in FIG. 3a, surface zener 345 and buried zener 335 are connected in parallel between resistor 325 and polycide Schottky diode 355. In FIG. 3b, Schottky diode 355 is formed from N+ emitter layer 320, which performs the shunt function of layer 25 in FIG. 1, polysilicon layer 30, barrier metal layer 40 and aluminum layer 50.

The surface zener is formed from the junction of N+ layer 320 and P+ base layer 312. The buried zener is formed from the junction between N+ layer 320 and P+ isolation layer 330. Layer 330 may have a resistivity of 5 ohms per square and a junction with layer 320 about 2 microns below the surface. Base region 312 may have a resistivity of about 200 ohms per square. The doping of emitter 320 may be about 1.5 E 16. With this choice of values, the "emitter" and "base" layers may be the same as those used for emitters and bases in bipolar processing.

In the prior art, the zeners in FIG. 3A would be replaced by two P-N junctions in series, with the result that four tubs would be required for the resistor, the two P-N diodes and the buried zener diode. With the present invention, a single tub holds the two diodes, so that only two tubs are required. If the resistor value is such that a first level polysilicon resistor can be used, then only a single tub would be required, with the resistor being placed over the field oxide at any convenient location.

The parameter values for the resistor and the Buried zener are set by the conventional process of plotting I-V curves at two temperatures and selecting the device parameters that produce the current value at the intersection of the two curves. Since the polycide Schottky has a temperature coefficient of about 4.4 mV/deg C., the zero temperature dependence current will have a lower magnitude than the corresponding current for the conventional approach, and will also be less sensitive to thermal changes during operation.

Those skilled in the art will readily be able to modify the invention disclosed herein as needed to suit their particular requirements. For example, in FIG. 1, the area in layer 35 indicated by the numeral 37 may be blocked from the implant or etched out afterwards, to prevent current flow through the top surface, if desired. A buried layer 70 with an epitaxial layer contact may be added to shield the diode from the parasitic capacitance to the substrate, the EPI or the well, by holding layer 60, the substrate or the well, as desired, at some voltage closer to the voltage of the diode than is the rest of the substrate. Diodes constructed according to the invention may also be used as discrete diodes with tailored $R_D$ and $V_F$ and/or in the zero temperature dependence embodiment of FIG. 3.

The invention has been illustrated as being formed with the use of the field oxide and first level poly in FIG. 1 and with poly 2 and an intermediate oxide in FIG. 2. Other vertical locations, such as formation in the EPI or in the substrate with the shunt region being a heavily doped layer in the EPI or substrate and positioned above an underlying layer having a net dopant concentration that provides the amount of resistivity required for isolation may be used if some particular application required it.

It should be understood that the invention is not limited to the particular embodiments shown and described herein, but that various changes and modifications may be made without departing from the spirit and scope of this novel concept as defined by the following claims.

What is claimed is:

1. An integrated circuit Schottky diode having a forward turn-on voltage, a dynamic forward resistance and a reverse breakdown voltage and comprising a layer of semiconductor material having an intrinsic bulk conductivity and disposed above an insulating substrate, an anode, and a cathode, said cathode comprising a layer of metal abutting a predetermined first surface of said layer of semiconductor material, characterized in that:

said layer of semiconductor material has a predetermined second surface opposite said first surface and abutting an insulating layer interface of an insulating layer;

a shunt region of said insulating layer interface and a shunt region of said second surface of said semiconductor material are doped with predetermined concentrations of a shunt dopant in a predetermined portion of said insulating layer interface abutting said layer of semiconductor material and extending from a first position opposite said cathode along said insulating layer interface to a second position in proximity to said anode, said predetermined concentration of said shunt dopant being such that said shunt region of said second surface of said semiconductor material has a greater conductivity than said intrinsic bulk conductivity of said layer of semiconductor material;

said anode is connected to said shunt region by a low-impedance electrical path, whereby current flow between said cathode and said anode passes preferentially through said shunt region of said second surface of said semiconductor material; and a high-impedance path is formed along said first surface between said anode and said cathode.

2. A diode according to claim 1, further characterized in that said layer of semiconductor material comprises a layer of silicon disposed above a substrate and said insulating layer comprises at least one compound from the group comprising silicon dioxide and silicon nitride.

3. A diode according to claim 1, further characterized in that said layer of silicon is a portion of an epitaxial layer of a silicon integrated circuit, said insulating layer is a buried-layer region of said epitaxial layer, and said shunt region of said insulating layer interface is a doped region extending into a portion of said epitaxial layer.

4. A diode according to claim 1, further characterized in that said layer of silicon is a layer of polycrystalline silicon deposited above said insulating layer that is disposed above a circuit element of an integrated circuit and in that said diode is electrically connected to a terminal of said circuit element.

5. A diode according to claim 4, further characterized in that said insulating layer is disposed above a circuit element of an integrated circuit.

6. A diode according to claim 4, further characterized in that said layer of silicon includes a forward voltage control layer formed by a forward dopant implanted in said first surface abutting said cathode, and in that said layer of polycrystalline silicon has a predetermined layer thickness and layer resistivity, whereby the forward turn-on voltage, the dynamic forward resistance and the reverse breakdown voltage of said diode may be controlled by a combination of said cathode material, said shunt dopant, said forward dopant, said layer thickness and said layer resistivity.

7. A diode according to claim 1, further characterized in that said layer of silicon includes a forward voltage control layer formed by a forward dopant implanted in said first surface abutting said cathode, whereby said forward turn-on voltage of said diode depends on a combination of said cathode material and said forward dopant.

8. A diode according to claim 1, further characterized in that said layer of silicon includes a forward voltage control layer formed by a forward dopant implanted in said first surface abutting said cathode, and in that said layer of polycrystalline silicon has a predetermined layer thickness and layer resistivity, whereby the forward turn-on voltage, and the dynamic forward resistance of said diode depends on a combination of said cathode material, said shunt dopant, said forward dopant, said layer thickness and said layer resistivity.

9. A diode according to claim 2, further characterized in that said first surface has a predetermined total resistance along a path between said anode and said cathode such that leakage current when said diode is reverse biased is below a predetermined limit.

10. A diode according to claim 9, further characterized in that said path between said anode and said cathode extends through a predetermined length of said layer of silicon having said intrinsic bulk resistivity.

11. An integrated circuit structure disposed in an epitaxial silicon layer having a layer surface and comprising a Schottky diode connected between a first node formed in a first region of said layer surface doped with a first polarity, a layer of a predetermined barrier metal, and a second node;

a surface zener diode connected between said first node and a third node and comprising a PN junction between said first region of said layer surface and a second doped region of said layer surface and connected to said third node; and a buried zener diode connected between said first node and said third node and comprising a PN junction between said first region of said substrate surface and a subsurface doped region of opposite polarity to said first polarity abutting a lower surface of said first region of said substrate surface and connected to said third node.

12. An integrated circuit Schottky diode having a forward turn-on voltage, a dynamic forward resistance and a reverse breakdown voltage and comprising a layer of semiconductor material having an intrinsic bulk conductivity and disposed above an insulating substrate, an anode, and a cathode, said cathode comprising a layer of metal abutting a predetermined first surface of said layer of semiconductor material and said anode abutting said predetermined first surface, whereby a first current path having a first path resistance and a first path length exists between said anode and said cathode, passing substantially along said first surface;

said layer of semiconductor material having a predetermined second surface opposite said first surface and abutting an insulating layer interface of an insulating layer, characterized in that:

a shunt region of said second surface of said semiconductor material is doped with a predetermined concentration of a shunt dopant in a predetermined portion of said insulating layer interface abutting said layer of semiconductor material and extending from a first position opposite said cathode along said insulating layer interface to a second position in proximity to said anode, said predetermined concentration of said shunt dopant being such that said shunt region of said second surface of said semiconductor material has a substantially greater conductivity than said intrinsic bulk conductivity of said layer of semiconductor material; and said anode is connected to said shunt region by a low-impedance electrical path, so that a second path having a second path resistance substantially less than said first path resistance and a second path length substantially greater than said first path length exists between said anode and said cathode, extending from said cathode through said layer of semiconductor material to said shunt region and then back along said low-impedance path through said layer of semiconductor material to said cathode, whereby current flow between said cathode and said anode passes preferentially through said shunt region of said second surface of said semiconductor material.

13. A diode according to claim 12, further characterized in that said layer of silicon is a portion of an epitaxial layer of a silicon integrated circuit, said insulating layer is a buried-layer region of said epitaxial layer, and said shunt region of said insulating layer interface is a doped region extending into a portion of said epitaxial layer.

14. A diode according to claim 12, further characterized in that said layer of silicon includes a forward voltage control layer formed by a forward dopant implanted in said first surface abutting said cathode, whereby said forward turn-on voltage of said diode depends on a combination of said cathode material and said forward dopant.

15. A diode according to claim 12, further characterized in that said layer of silicon includes a forward voltage control layer formed by a forward dopant implanted in said first surface abutting said cathode, and in that said layer of polycrystalline silicon has a predetermined layer thickness and layer resistivity, whereby the forward turn-on voltage, and the dynamic forward resistance of said diode depends on a combination of said cathode material, said shunt dopant, said forward dopant, said layer thickness and said layer resistivity.

16. A diode according to claim 12, further characterized in that said first surface has a predetermined total resistance along a path between said anode and said cathode such that leakage current when said diode is reverse biased is below a predetermined limit.

17. A diode according to claim 16, further characterized in that said path between said anode and said cathode extends through a predetermined length of said layer of silicon having said intrinsic bulk resistivity.

* * * * *